(12) United States Patent
Thoss et al.

(10) Patent No.: US 10,436,608 B2
(45) Date of Patent: Oct. 8, 2019

(54) INDUCTIVE PROXIMITY SENSOR

(71) Applicant: SICK AG, Waldkirch (DE)

(72) Inventors: Sascha Thoss, Waldkirch (DE); Andreas Peter, Waldkirch (DE); Olaf Machul, Waldkirch (DE)

(73) Assignee: SICK AG, Waldkirch (DE)

( * ) Notice: Subject to any disclaimer, the term of this patent is extended or adjusted under 35 U.S.C. 154(b) by 172 days.

(21) Appl. No.: 15/671,455

(22) Filed: Aug. 8, 2017

(65) Prior Publication Data

US 2018/0045538 A1 Feb. 15, 2018

(30) Foreign Application Priority Data

Aug. 12, 2016 (DE) .................. 10 2016 115 015

(51) Int. Cl.
| G01D 5/22 | (2006.01) |
| G01B 7/02 | (2006.01) |
| G01D 3/036 | (2006.01) |
| G01D 5/20 | (2006.01) |
| G01D 11/24 | (2006.01) |
| H03K 17/95 | (2006.01) |

(52) U.S. Cl.
CPC ........... *G01D 5/2208* (2013.01); *G01B 7/023* (2013.01); *G01D 3/0365* (2013.01); *G01D 5/204* (2013.01); *G01D 11/245* (2013.01); *H03K 17/952* (2013.01); *H03K 17/9512* (2013.01); *H03K 2217/94031* (2013.01)

(58) Field of Classification Search
CPC .... G01D 5/2208; G01D 5/204; G01D 3/0365; G01D 11/245; H03K 17/9512; H03K 17/952; H03K 2217/94031; G01B 7/023

USPC ............................................. 324/207.15, 334
See application file for complete search history.

(56) References Cited

U.S. PATENT DOCUMENTS

| 2002/0053908 A1 | 5/2002 | Candy | |
| 2015/0083900 A1* | 3/2015 | Caley | G01S 7/4811 |
| | | | 250/221 |
| 2016/0076912 A1* | 3/2016 | Polik | G01D 5/2053 |
| | | | 702/66 |

FOREIGN PATENT DOCUMENTS

| DE | 69000465 T2 | 5/1993 |
| DE | 197 31 560 A1 | 2/1999 |
| DE | 102007001821 A1 | 7/2008 |
| DE | 102010041288 B3 | 12/2011 |

(Continued)

OTHER PUBLICATIONS

Office Action dated Jul. 5, 2017 issued in corresponding German Application No. 10 2016 115 015.0.

*Primary Examiner* — Farhana A Hoque
(74) *Attorney, Agent, or Firm* — Nath, Goldberg & Meyer; Jerald L. Meyer; Stanley N. Protigal

(57) ABSTRACT

A method and an inductive proximity sensor for detecting an object having at least one coil, wherein at least one transmission current pulse can be applied to the coil by a control and evaluation unit and having the control and evaluation unit for outputting an object detection signal, wherein the control and evaluation unit is configured to scan at least one induced voltage pulse that is generated by the transmission current pulse at the coil in at least one section from or after the point in time of the application of the transmission current pulse up to the point in time of the complete attenuation of the voltage pulse and to form scan values, whereby the voltage pulse is digitized.

18 Claims, 4 Drawing Sheets

(56) References Cited

FOREIGN PATENT DOCUMENTS

DE  102011004538 A1  8/2012
EP  1 289 147 A1  3/2003

* cited by examiner

INDUCTIVE PROXIMITY SENSOR

FIELD

The present invention relates to an inductive proximity sensor for detecting an object having at least one coil, wherein at least one transmission current pulse can be applied to the coil by a control and evaluation unit, and having the control and evaluation unit for outputting an object detection signal. The invention further relates to a method of detecting an object having an inductive proximity sensor, having at least one coil, wherein at least one transmission current pulse is applied to the coil by a control and evaluation unit and having the control and evaluation unit for outputting an object detection signal.

BACKGROUND

Inductive proximity sensors are used as contactless switches in a harsh environment. An important quality feature in this respect is the maximum achievable switching distance.

An important quality feature of inductive sensors in addition to the amount of a nominal switching distance SN, that is defined for steel, is also the amount of the real switching distance that is achieved with other materials. These switching distances are determined by so-called reduction factors. The greater the switching distance or the reduction factor, the better. The sensor ideally has the same high switching distance for any desired metals. The reduction factors in this case have the maximum value 1 and are therefore called factor 1 sensors or F1 sensors.

Average inductive sensors typically only have a two-fold switching distance, no F1 property, and usually plastic housings having a plastic front face.

SUMMARY

It is an object of the invention to provide an inductive proximity sensor that can be used in very harsh environments, that has a high switching distance, and that has a factor 1 behavior with different metal objects composed of different metal alloys.

It is a further object of the invention to provide an inductive proximity sensor that can be accommodated in different sensor housings composed of respective different materials.

It is a further object to provide an inductive proximity sensor that can be used in a versatile manner.

The object is satisfied by an inductive proximity sensor for detecting an object having at least one coil, wherein at least one transmission current pulse can be applied to the coil by a control and evaluation unit and having the control and evaluation unit for outputting an object detection signal, wherein the control and evaluation unit is configured to scan at least one induced voltage pulse that can be generated by the transmission current pulse at the coil in at least one section from or after the point in time of the application of the transmission current pulse up to the point in time of the complete attenuation of the voltage pulse and to form scan values, whereby the voltage pulse is digitized, wherein the control and evaluation unit is configured to evaluate the scan values of at least two voltage pulses for a distance determination of a metallic object.

The object is further satisfied by a method of detecting an object having an inductive proximity sensor, having at least one coil, wherein at least one transmission current pulse is applied to the coil by a control and evaluation unit, and having the control and evaluation unit for outputting an object detection signal, wherein at least one induced voltage pulse that is generated by the transmission current pulse at the coil is scanned in at least one section from or after the point in time of the application of the transmission current pulse up to the point in time of the complete attenuation of the voltage pule and scan values are formed, whereby the voltage pulse is digitized, wherein the control and evaluation unit is configured to evaluate the scan values of at least two voltage pulses for a distance determination of a metallic object.

In accordance with the invention, the voltage pulse or a portion of the voltage pulse is digitized. The great advantage comprises a lot more information thereby being able to be acquired from the voltage pulse, whereby a maximum information content is available in digital form. The inductive proximity sensor thereby has a high switching distance.

A high switching distance has even further advantages in addition to the obvious advantage that an object can already be detected at larger distances. The higher the switching distance of the sensor, the greater the potential distance can be from the object to be detected. The likelihood of mechanical destruction is thereby reduced.

A further advantage of large switching distances is a larger installation tolerance. An engineer thereby does not have to work so precisely on the assembly of the sensor, which saves time and money and increases an availability of a system having the sensor.

A further advantage is the miniaturization potential. With a specific sensor diameter, a larger switching distance can be realized or with a specific switching distance, the sensor diameter can be reduced, whereby construction advantages are achieved.

In a further development of the invention, the voltage pulse is digitized from the point in time of the application of the transmission current pulse up to the point in time of the complete attenuation of the voltage pulse. The total voltage pulse is thus scanned and scan values are generated at the scan points.

Respective different objects can be distinguished from one another by the analysis of the total pulse response. The objects can thus be classified and, for example, different object detection signals can be output. Provision can, however, also be made only to output an object detection signal with a specific predefined object and not to output an objection detection signal with other objects.

In accordance with an embodiment, the inductive proximity sensor has a first coil as the transmitter coil and a second coil as the receiver coil, wherein the transmission current pulse flows through the transmitter coil and the resulting pulse voltage of the voltage pulse is measured at the receiver coil.

This advantageous embodiment comprises using a transmitter coil and a receiver coil instead of a single coil. In this respect, the transmission current pulse is only applied to the transmitter coil and the voltage pulse is measured at the receiver coil. This further development makes it possible to optimize the signal-to-noise ratio with the aid of the winding relationships.

In a further development of the invention, switching means are present, with the first coil and the second coil being switchable in parallel or with the first coil and the second coil being switchable in series.

For example, both coils can be switched in parallel for transmission and the coils are switched in series for reception. A sensitivity of the sensor can thereby be further increased.

Provision can furthermore also be made to use a single coil for transmission and to switch both coils in series for reception. A sensitivity of the sensor is also thereby increased.

The switching means are in this respect controlled by the control and evaluation unit. The switching means are in this respect, for example, formed by a transistor circuit or by the control and evaluation unit itself.

According to the invention, the control and evaluation unit is configured to evaluate the scan values of at least two voltage pulses for a distance determination of a metallic object, whereby a better evaluation takes place by the control and evaluation unit.

In a preferred embodiment of the invention, the control and evaluation unit is configured to evaluate the scan values of at least two voltage pulses for a distance determination of a metallic object, with scan points being displaced with respect to one another with respect to the start of the voltage pulse, whereby the time resolution of the voltage pulse is increased by the displacement and by a superposition.

An important point comprises the scan values of a plurality of voltage pulses that are recorded after one another being combined with one another. The scan points or the scan times of a plurality of voltage pulses are slightly displaced with respect to one another and the time resolution is increased beyond the Nyquist rate preset by the scanning rate.

Very high frequency information can thereby also be acquired from the voltage pulse that would be lost due to the filter effect of an analog integration.

Furthermore, filtering can be greater due to the large number of available scan points, whereby a signal-to-noise ratio is improved and an amplitude resolution increases.

In a further development of the invention, an analog-to-digital converter or ADC is provided for the scanning of the voltage pulse. The analog-to-digital converter is directly connected to a microcontroller, for example. The analog-to-digital converter is a part of the control and evaluation unit. The control and evaluation unit can, for example, have a microcontroller, a digital signal processor, a digital signal controller or similar.

In a further development, a time-to-digital converter is provided for the scanning of the voltage pulse. A so-called time-to-digital converter or TDC is an electronic assembly that measures very short time intervals and converts them into digital values. Time intervals from 1 nanosecond onward can be measured, for example.

In a further development, the control and evaluation unit is configured to scan at least one voltage value between two voltage pulses and to form scan values and the control and evaluation unit is configured to carry out a compensation of low frequency interference and offsets from these scan values.

In a further development of the invention, an amplifier is provided between the coil and the analog-to-digital converter for impedance conversion and level conversion.

The amplifier is, for example, deployed between the receiver coil and the analog-to-digital converter. The use of the amplifier has at least three advantages.

First, an impedance conversion can be carried out using the amplifier so that the receiver coil can be tapped at high ohms. No current or only a very small current thereby flows in the receiver coil and no retroactive effect on the object occurs. In addition, the scanning circuit in the input of the analog-to-digital converter does not generate any interference on the reception voltage when an amplifier is used as a buffer.

Second, the amplifier can also simultaneously be used as an anti-aliasing filter for the analog-to-digital converter if the amplifier has a low pass behavior.

The third advantage comprises the amplifier being configured to carry out a buffering and a pre-amp gain, whereby the signal-to-noise ratio and thus ultimately also the maximum achievable switching distance is improved.

In a preferred embodiment of the invention, at least the coil and the control and evaluation unit are arranged in a metal housing, with at least one end face having the coil having a metallic end face that is connected to a metallic jacket.

The mechanical robustness, namely an impact resistance, a pressure resistance or a resistance to abrasion or scratching of the sensor is thereby increased. The chemical resistance is furthermore improved by the metallic housing. For example, on the use of stainless steel, for example of V4A, there is a resistance to salt water and to most cleaning agents. The sensor head is hermetically sealed by the connection.

The metallic end face can in this respect, for example, be connected with material continuity, by welding, by screws, by pressing or by a comparable connection technique.

In a further development of the invention, the control and evaluation unit is configured to use at least one scan value from at least one voltage pulse to calculate an object property.

Which metal the detected object is composed of can, for example, thereby be determined. It can, for example, be distinguished whether the object is composed of steel, stainless steel, aluminum or, for example, non-ferrous metal.

In a further development of the invention, the control and evaluation unit is configured to carry out a digital integration in a time window from or after the start of the voltage pulse or current pulse to generate a distance signal.

The distance signal in this respect itself includes information on the distance of the object so that these distance data can be processed by a downstream control. The distance signal can in this respect be the object detection signal itself. Provision can, however, also be made that an additional distance signal to the object detection signal is output.

The digital scanning and the digital post-processing of the pulses also allows the use of different integration windows, in part also overlapping integration windows, on the same voltage pulse.

In a preferred embodiment of the invention, the control and evaluation unit is configured to form and evaluate a sign of a difference between at least one reference value stored in a memory and at least one scan value to determine whether the object is ferromagnetic or not.

A material recognition can be carried out, for example. In addition to the digital integration that allows a factor 1 signal to be generated with objects from aluminum and steel, it is also possible to decide whether it is a ferromagnetic object or not.

For this purpose, the difference is formed between scan values of a voltage pulse and stored reference values. Depending on the sign of this result, a decision can be made on whether it is a ferromagnetic target or not.

In a further development of the invention, the control and evaluation unit is configured to determine and evaluate a pulse level, a pulse maximum, the time of the pulse maximum, a pulse length and/or zero crossings of the voltage pulse, whereby the control and evaluation unit forms the distance signal.

The switching distance can thereby be further increased since the named characteristics of the voltage pulse deliver features to carry out a plurality of evaluation processes.

In a further development, the control and evaluation unit is configured to form a difference from two voltage pulses recorded after one another in time to generate the distance signal therefrom.

The inductive sensor is, for example, connected to a voltage source to generate the transmission current pulse. The inductive sensor could, however, also be battery operated.

It can be advantageous to generate the transmission current pulse with the aid of a voltage source and, for example, with a precision resistance since very precise currents of stable temperature can be generated with this combination. For this purpose, the voltage source is connected via a switch and via a serial resistor to the coil by the control and evaluation unit. The voltage source is subsequently disconnected from the coil. A very high current change per time (di/dt) thereby arises that results in a large magnetic field change that in turn has the result that an eddy current is induced in a conductive object that is located in the detection zone of the sensor. This eddy current then induces a voltage in the receiver coil that is digitized by the evaluation unit.

In a further development of the invention, a resistor is connected in parallel with the coil to restrict the level of the voltage pulse and to protect the control and evaluation electronics from destruction.

The use of a parallel resistor to the coil is further advantageous. The level and the shape of the voltage coil can be varied by this measure. The control and evaluation unit can thus be protected from destruction due to an electrical surge, on the one hand, and there is the possibility, on the other hand, to influence the frequency portions of the voltage pulse. It is, for example, advantageous with metal housings for the pulse to have more low frequency portions since they are able to pass through the metallic end face or the metal front of the sensor housing. This behavior can be achieved with a relatively low ohm parallel resistor.

BRIEF DESCRIPTION OF THE DRAWINGS

The invention will also be explained in the following with respect to further advantages and features with reference to the enclosed drawing and to embodiments. The Figures of the drawing show in.

In the following Figures, identical parts are provided with identical reference numerals.

DETAILED DESCRIPTION

Figure 1:
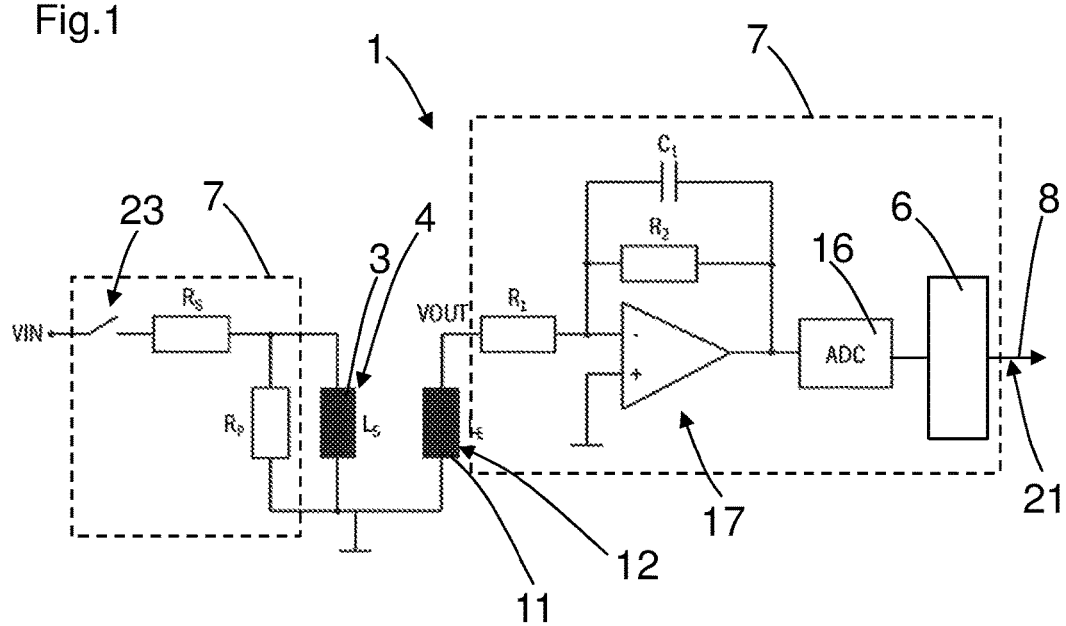
FIG. 1 an inductive proximity sensor in accordance with the invention.

FIG. 1 shows an inductive proximity sensor 1 for detecting an object having at least one coil 3, wherein at least one transmission current pulse is applied to the coil 3 by a control and evaluation unit 7, and having the control and evaluation unit 7 for outputting an object detection signal 8, wherein the control and evaluation unit 7 is configured to scan at least one induced voltage pulse that is generated by the transmission current pulse at the coil 3 in at least one section from or after the point in time of the application of the transmission current pulse up to the point in time of the complete attenuation of the voltage pulse and to form scan values, whereby the voltage pulse is digitized.

Figure 2:
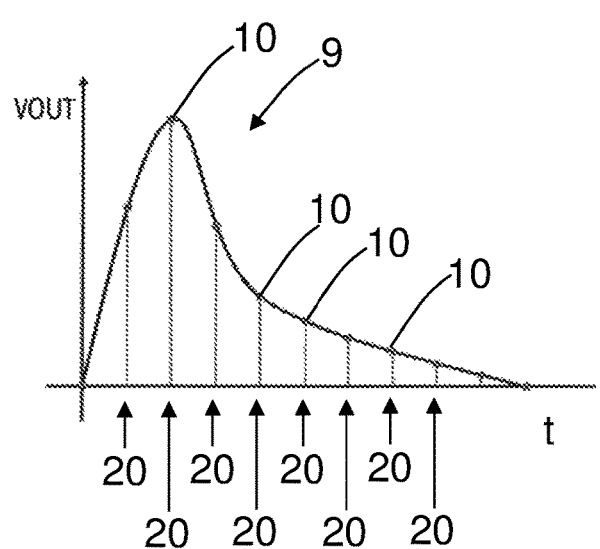
FIG. 2 a voltage pulse.

FIG. 2 shows a voltage pulse 9. In accordance with FIG. 2, the voltage pulse 9 is digitized from or after the point in time of the application of the transmission current pulse up to the point in time of the complete attenuation of the voltage pulse 9. The total voltage pulse 9 is thus scanned and scan values 10 are generated at the scan points 20 or scan times.

In accordance with FIG. 1, the inductive proximity sensor 1 has the first coil 3 as the transmitter coil 4 and a second coil 11 as the receiver coil 12, wherein the transmission current pulse flows through the transmitter coil 4 and the resulting pulse voltage of the voltage pulse is measured at the receiver coil 12.

In this respect, the transmission current pulse is only applied to the transmitter coil 4 and the voltage pulse is measured at the receiver coil 12.

In accordance with FIG. 1, an analog-to-digital converter 16 is provided for the scanning of the voltage pulse. The analog-to-digital converter 16 is, for example, directly connected to a microcontroller 6 of the control and evaluation unit 7. The control and evaluation unit 7 can, for example, also have a digital signal processor, a digital signal controller or similar instead of a microcontroller 6.

In accordance with FIG. 1, the control and evaluation unit 7 is configured to scan voltage values between two voltage pulses and to form scan values and the control and evaluation unit 7 is configured to carry out a compensation of low frequency interference and offsets from these scan values.

In accordance with FIG. 1, an amplifier 17 is provided between the coil 3 and the analog-to-digital converter 16 for impedance conversion and level adaptation, with further components such as resistors or, for example, the receiver coil likewise being arranged between the analog-to-digital converter 16 and the coil 3.

The amplifier 17 is, for example, deployed between the receiver coil 12 and the analog-to-digital converter 16. The gain can be set using the resistors R1 and R2. The combination of the resistor R2 and the capacitor C1 determines the cut-off frequency of the formed low pass filter.

First, an impedance conversion can be carried out by the amplifier 17 so that the receiver coil 12 can be tapped at high ohms. No current or only a very small current thereby flows in the receiver coil 12 and no retroactive effect on the object occurs. In addition, the scanning circuit in the input of the analog-to-digital converter 16 does not generate any interference on the reception voltage when an amplifier 17 is used as a buffer.

Second, the amplifier 17 can also simultaneously be used as an anti-aliasing filter for the analog-to-digital converter 16 if the amplifier 17 has a low pass behavior.

The third advantage comprises the amplifier 17 being configured to carry out a buffering and a pre-amp gain, whereby the signal-to-noise ratio and thus ultimately also the maximum achievable switching distance is improved.

In accordance with FIG. 1 the control and evaluation unit 7 is configured to use at least one scan value from at least one voltage pulse to calculate an object property.

In accordance with FIG. 1, the control and evaluation unit 17 is configured to carry out a digital integration in a time window from the start of the voltage pulse or current pulse to generate a distance signal 21.

The distance signal 12 in this respect itself includes information on the distance of the object so that these distance data can be processed by a downstream control.

In accordance with FIG. 1, a resistor RS and a switch 23 are provided to generate a transmission current pulse.

In addition to the use of a current source for pulse generation, it can be advantageous to generate the transmission current pulse with the aid of a voltage supply and with a precision resistance since very precise currents of stable temperature can be generated with this combination. For this purpose, the voltage supply is connected to the coil 3 via a switch 23 and via a serial resistor RS. The voltage supply is subsequently disconnected from the coil 3. A very high current change per time (di/dt) thereby arises that results in a large magnetic field change that in turn has the result that an eddy current is induced in a conductive object that is located in the detection zone of the sensor. This eddy current then induces a voltage in the receiver coil 12 that is digitized by the control and evaluation unit 7.

In accordance with FIG. 1, a resistor RP is connected in parallel with the coil 3 to restrict a level of the voltage pulse. The level and the shape of the voltage pulse can be varied by this measure. The control and evaluation unit 7 can thus be protected from destruction due to an electrical surge, on the one hand, and there is the possibility, on the other hand, to influence the frequency portions of the voltage pulse.

Figure 3:
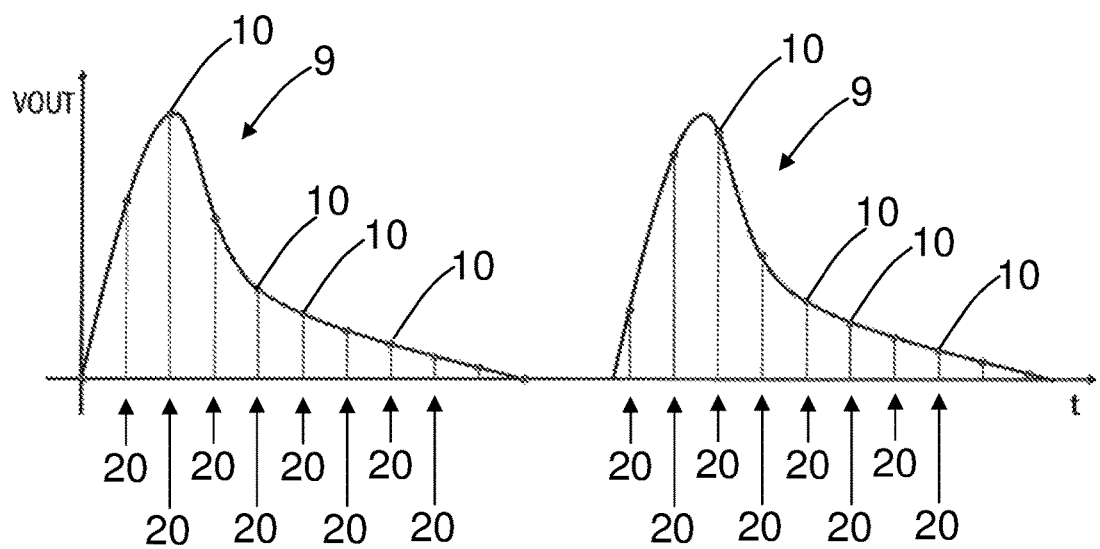
FIG. 3 two consecutive voltage pulses.
Figure 4:
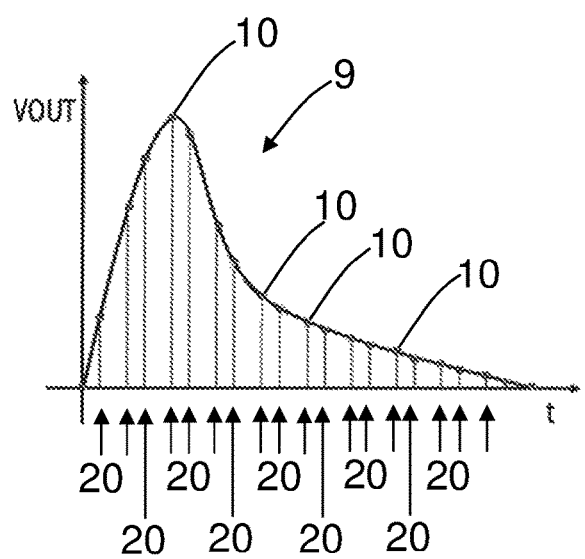
FIG. 4 a voltage pulse with combined scan values.

In accordance with FIG. 3, the control and evaluation unit is configured to evaluate the scan values 10 of at least two voltage pulses 9 for a distance determination of a metallic object, with scan points 20 or scan times being displaced with respect to one another with respect to the start of the voltage pulse 9, as shown in FIG. 4, whereby the time resolution of the voltage pulse 9 is increased by the displacement and a superposition.

In accordance with FIG. 4, the scan values 10 of a plurality of voltage pulses 9 that are recorded after one another are combined with one another. The scan points 20 or the scan times of a plurality of voltage pulses 9 are slightly displaced with respect to one another and the time resolution is increased beyond the Nyquist rate preset by the scanning rate.

Figure 6:
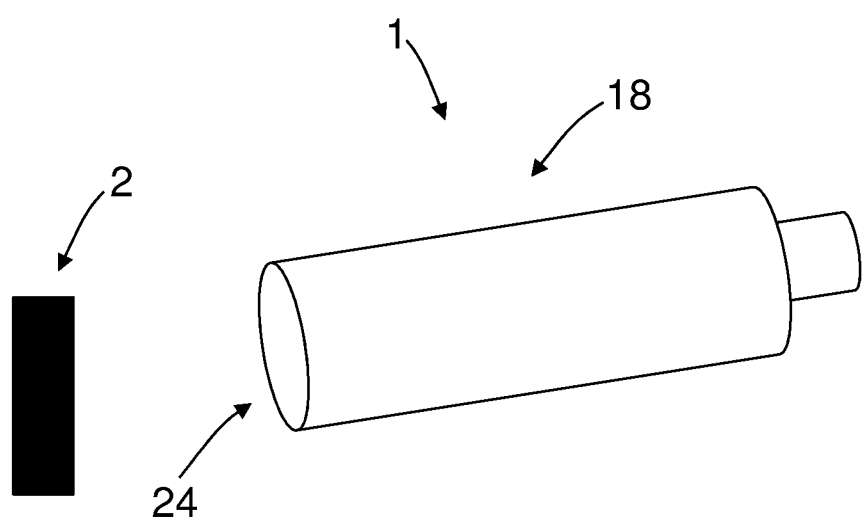
FIG. 6 an inductive proximity sensor in a metal housing.

In accordance with FIG. 6, at least the coil and the control and evaluation unit are arranged in a metal housing 18, with at least one end face 24 having the coil having a metallic end face 24 that is connected to a metallic jacket. The object 2 is located before the inductive proximity sensor 1.

The mechanical robustness, namely an impact resistance, a pressure resistance or a resistance to abrasion or scratching of the inductive proximity sensor 1 is thereby increased. The robustness and the chemical resistance are furthermore improved by the metallic housing or by the metal housing 18. The sensor head is hermetically sealed by the connection.

Figure 5:
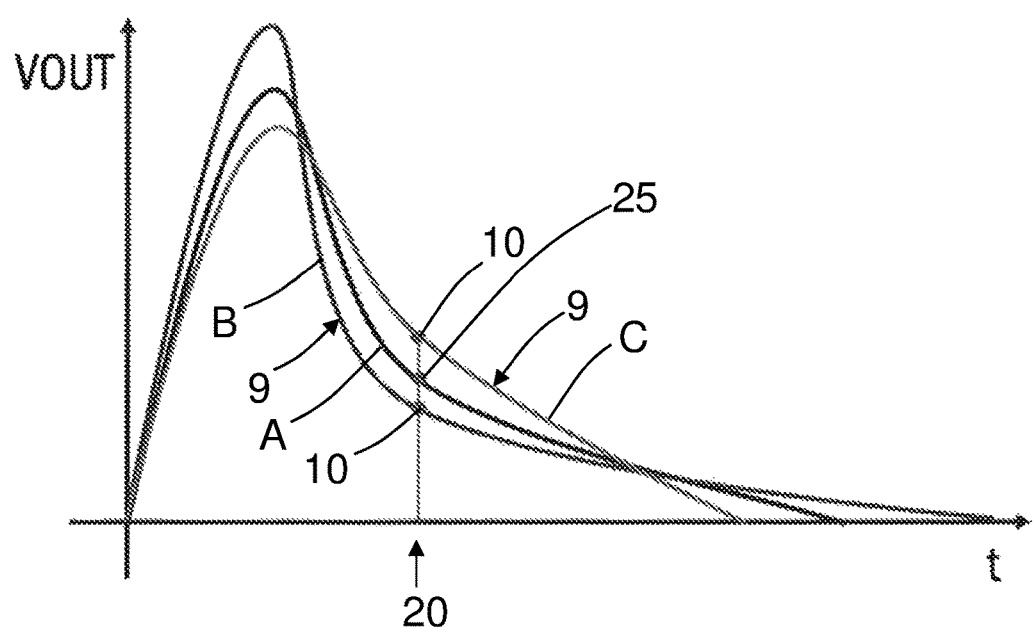
FIG. 5 two voltage pulses and a reference value.

FIG. 5 shows three curves. Curve A is a curve with reference values without object detection. Curves B and C are curves with scan values at respective different objects.

In accordance with FIG. 5, the control and evaluation unit is configured to form and evaluate a sign of a difference between at least one reference value 25 stored in a memory and at least one scan value 10 to determine whether the object is ferromagnetic or not.

For this purpose, the difference is formed between scan values 10 of a voltage pulse 9 and stored reference values 25. Depending on the sign of this result, a decision can be made whether it is a ferromagnetic target or not.

In accordance with FIG. 5, the control and evaluation unit is configured to determine and evaluate a pulse level, a pulse maximum, the time of the pulse maximum, a pulse length and/or zero crossings of the voltage pulse 9, whereby the control and evaluation unit forms the distance signal.

In accordance with FIG. 5, the control and evaluation unit is configured to form a difference from two voltage pulses 9 recorded after one another in time to generate the distance signal therefrom.

REFERENCE NUMERALS

1 inductive proximity sensor
2 object
3 coil, first coil
4 transmitter coil
6 microcontroller
7 control and evaluation unit
8 object detection signal
9 voltage pulse
10 scan values
11 second coil
12 receiver coil
16 analog-to-digital converter
17 amplifier
18 metal housing
20 scan points
21 distance signal
23 switch
24 end face
25 reference value

The invention claimed is:

1. An inductive proximity sensor for detecting an object, the inductive proximity sensor comprising:
   at least one coil, and
   a control and evaluation unit for outputting an object detection signal wherein at least one transmission current pulse can be applied to the at least one coil by the control and evaluation unit,
   wherein the control and evaluation unit is further configured to scan at least one induced voltage pulse that is generated by the transmission current pulse at the at least one coil in at least one section from or after the point in time of the application of the transmission current pulse up to the point in time of the complete attenuation of the voltage pulse and to form scan values, whereby the voltage pulse is digitized,
   wherein the control and evaluation unit is configured to evaluate the scan values of at least two consecutive voltage pulses for a distance determination of a metallic object,
   and wherein the scan values of a plurality of voltage pulses that are recorded after one another are combined with one another.

2. The inductive proximity sensor in accordance with claim 1,
   wherein the voltage pulse is digitized from the point in time of the application of the transmission current pulse up to the point in time of the complete attenuation of the voltage pulse.

3. The inductive proximity sensor in accordance with claim 1,
   wherein the inductive proximity sensor has a first coil as the transmitter coil and a second coil as the receiver coil,
   wherein the transmission current pulse flows through the transmitter coil and the resulting pulse voltage of the voltage pulse is measured at the receiver coil.

4. The inductive proximity sensor in accordance with claim 3,
wherein switching means are present, with the first coil and the second coil being connectable in parallel or with the first coil and the second coil being connectable in series.

5. The inductive proximity sensor in accordance with claim 1,
wherein the control and evaluation unit is configured to evaluate the scan values of at least two voltage pulses for a distance determination of a metallic object, with scan points being displaced with respect to one another with respect to the start of the voltage pulse, whereby the time resolution of the voltage pulse is increased by the displacement and a superposition.

6. The inductive proximity sensor in accordance with claim 1,
wherein an analog-to-digital converter is provided for the scanning of the voltage pulse.

7. The inductive proximity sensor in accordance with claim 1,
wherein a time-to-digital converter is provided for the scanning of the voltage pulse.

8. The inductive proximity sensor in accordance with claim 1,
wherein the control and evaluation unit is configured to scan at least one voltage value between two voltage pulses and to form scan values and the control and evaluation unit is configured to carry out a compensation of low frequency interference and offsets from these scan values.

9. The inductive proximity sensor in accordance with claim 6,
wherein an amplifier is provided between the at least one coil and the analog-to-digital converter for impedance conversion and level adaptation.

10. The inductive proximity sensor in accordance with claim 1,
wherein at least the at least one coil and the control and evaluation unit is arranged in a metal housing, with at least one end face having the at least one coil having a metallic end face that is connected to a metallic jacket.

11. The inductive proximity sensor in accordance with claim 1,
wherein the control and evaluation unit is configured to calculate at least one scan value from at least one voltage pulse for calculating an object property.

12. The inductive proximity sensor in accordance with claim 1,
wherein the control and evaluation unit is configured to carry out a digital integration in a time window from or after the start of the voltage pulse or current pulse to generate a distance signal.

13. The inductive proximity sensor in accordance with claim 1,
wherein the control and evaluation unit is configured to form and evaluate a sign of a difference between at least one reference value stored in a memory and at least one scan value to determine whether the object is ferromagnetic or not.

14. The inductive proximity sensor in accordance with claim 1,
wherein the control and evaluation unit is configured to evaluate at least one of a pulse level, a pulse length and zero crossings of the voltage pulse, whereby the control and evaluation unit forms the distance signal.

15. The inductive proximity sensor in accordance with claim 1,
wherein the control and evaluation unit is configured to form a difference from two voltage pulses recorded after one another in time and is configured to generate the distance signal therefrom.

16. The inductive proximity sensor in accordance with claim 1,
wherein a voltage source and a resistor are used to generate a current pulse.

17. The inductive proximity sensor in accordance with claim 1,
wherein a resistor is connected in parallel with the at least one coil to restrict a level of the voltage pulse to protect the control and evaluation electronics from destruction.

18. A method of detecting an object using an inductive proximity sensor, the inductive proximity sensor comprising at least one coil, and a control and evaluation unit for outputting an object detection signal,
wherein at least one transmission current pulse is applied to the coil by the control and evaluation unit, the method comprising the steps of:
scanning at least one induced voltage pulse that is generated by the transmission current pulse at the at least one coil in at least one section from or after the point in time of the application of the transmission current pulse up to the point in time of the complete attenuation of the voltage pulse and
forming scan values, whereby the voltage pulse (9) is digitized,
wherein the control and evaluation unit is configured to evaluate the scan values of at least two consecutive voltage pulses for a distance determination of a metallic object,
and wherein the scan values of a plurality of voltage pulses that are recorded after one another are combined with one another.

* * * * *